(12) United States Patent
Hwang

(10) Patent No.: US 10,886,276 B2
(45) Date of Patent: Jan. 5, 2021

(54) SEMICONDUCTOR MEMORY DEVICE AND METHOD OF FABRICATING THE SAME

(71) Applicant: Seoul National University R&DB foundation, Seoul (KR)

(72) Inventor: Cheol Seong Hwang, Seoul (KR)

(73) Assignee: Seoul National University R&DB foundation, Seoul (KR)

( * ) Notice: Subject to any disclaimer, the term of this patent is extended or adjusted under 35 U.S.C. 154(b) by 0 days.

(21) Appl. No.: 15/268,602

(22) Filed: Sep. 18, 2016

(65) Prior Publication Data
US 2017/0084613 A1 Mar. 23, 2017

(30) Foreign Application Priority Data
Sep. 18, 2015 (KR) .......................... 10-2015-0132080

(51) Int. Cl.
*H01L 27/108* (2006.01)
*H01L 23/528* (2006.01)

(52) U.S. Cl.
CPC .. *H01L 27/10808* (2013.01); *H01L 27/10855* (2013.01)

(58) Field of Classification Search
CPC ......... H01L 27/10808; H01L 27/10855; H01L 23/5283
USPC ....................................................... 257/296
See application file for complete search history.

(56) References Cited

U.S. PATENT DOCUMENTS

| | | | | |
|---|---|---|---|---|
| 6,002,574 A * | 12/1999 | Metzler | ................... | H01G 4/08 257/E21.019 |
| 6,163,046 A * | 12/2000 | Okumura | .......... | H01L 27/10844 257/296 |
| 6,576,946 B1 * | 6/2003 | Kanai | ..................... | H01L 28/91 257/306 |
| 6,593,185 B1 * | 7/2003 | Tsai | ........................ | H01L 28/90 257/E21.018 |
| 8,742,541 B2 * | 6/2014 | Mohammed | ............. | H01G 4/06 257/298 |
| 10,157,978 B2 * | 12/2018 | Oganesian | ............ | H01L 23/481 |
| 2002/0098654 A1 * | 7/2002 | Durcan | ............. | H01L 27/10888 438/267 |
| 2003/0104701 A1 * | 6/2003 | Wang | ..................... | H01L 28/91 438/694 |
| 2004/0000684 A1 * | 1/2004 | Park | .................. | H01L 27/10814 257/304 |

(Continued)

Primary Examiner — Ori Nadav

(57) ABSTRACT

Provided are a semiconductor memory device including a capacitor and a method of fabricating the same. The capacitor may include a plurality of contacts that are electrically connected to the switching device, exposed on the top surface of a substrate, and are arranged in a first direction and a second direction different from the first direction, and the first direction and the second direction are parallel to the substrate; mold insulators that are formed on the substrate between the contacts adjacent to one another in the first direction from among the plurality of contacts, are formed to have a predetermined thickness and have a predetermined width in the second direction, and extend in a direction vertical to the substrate; bottom electrodes that have a vertical plate-like structure, are provided on and supported by sidewalls of the mold insulators, and are electrically and respectively connected to the plurality of contacts.

13 Claims, 15 Drawing Sheets

(56) References Cited

U.S. PATENT DOCUMENTS

| | | | |
|---|---|---|---|
| 2006/0289914 A1* | 12/2006 | Juengling | H01L 27/10855 257/296 |
| 2007/0294871 A1* | 12/2007 | Felsner | H01G 4/228 29/25.03 |
| 2011/0057293 A1* | 3/2011 | Tsai | H01L 23/5223 257/532 |
| 2012/0181658 A1* | 7/2012 | Mohammed | H01G 4/06 257/532 |
| 2016/0055976 A1* | 2/2016 | Song | H01L 23/49822 174/260 |

* cited by examiner

SEMICONDUCTOR MEMORY DEVICE AND METHOD OF FABRICATING THE SAME

CROSS-REFERENCE TO RELATED APPLICATION

This application claims priority of Korean Patent Application No. 10-2015-0132080, filed on Sep. 18, 2015, in the KIPO (Korean Intellectual Property Office), the disclosure of which is incorporated herein entirely by reference.

BACKGROUND OF THE INVENTION

Field of the Invention

The present invention relates to a memory technique, and more particularly, to a semiconductor memory device including a capacitor and a method of fabricating the same.

Description of the Related Art

From among semiconductor memory devices, a direct random access memory (DRAM) includes a memory cell that consists of a switching device that controls read/write operations and a capacitor for storing data. As the scale of the DRAM shrinks, an area of a memory cell occupied by a capacitor is continuously decreasing. As a technique for securing a sufficient effective capacitance in front of a shrink cell area, a technique for providing a 3-dimensional bottom electrode, such as a cylinder-type or fin-type bottom electrode, and a technique for increasing height of a bottom electrode have been suggested.

However, as DRAM scaling down equal to or below 20 nm is demanded, a change of structure of a capacitor in correspondence thereto encounters a greater difficulty of securing sufficient capacitance. As techniques related to super high-k dielectric layers and electrode materials for securing sufficient capacitance are developed, an equivalent oxide thickness (EOT) have been reduced to a value below or equal to 0.4 nm. For example, a thesis published from the page 7,910 to the page 7,917 of the 2014 ACS Appl. Mater. Interfaces 6 discloses an Al-doped $TiO_2$ having 0.37 nm EOT with a physical thickness from about 8 nm to about 9 nm. However, in order to materialize such an improved electric characteristic into a 3-dimensional structure, it is necessary to restrict physical thicknesses of a dielectric thin-film and an electrode below a certain thickness. If the thicknesses cannot be sufficiently reduced to such a level, the corresponding 3-dimensional structure cannot be embodied regardless of electric characteristics.

For example, in order to maximize a surface area of a bottom electrode of a capacitor of a DRAM, the bottom electrode has a cylindrical structure and includes a titanium nitride (TiN) layer. However, under a design rule equal to or below 20 nm, it is extremely difficult to secure a space for disposing two overlapping dielectric layers and a single layer upper electrode inside the cylindrical structure. If thickness of the bottom electrode becomes more reduced in order to resolve the problem, the structural stability of the cylindrical structure will be deteriorated, and thus sufficient production yield cannot be obtained.

SUMMARY OF THE INVENTION

The present invention provides a semiconductor memory device including highly integrated capacitors having simple bottom electrode structure in order to confront severe scaling-down of the semiconductor memory device, secure sufficient capacitance, and reduce defect to resolve leakage current and insulation breakdown.

The present invention also provides a method of fabricating a semiconductor memory device for easily and reliably fabricating a semiconductor memory device having the above-stated advantages.

According to an aspect of the present invention, there is provided a semiconductor memory device including a plurality of memory cells, wherein each of the plurality of memory cells includes a switching device and a capacitor that is electrically connected to the switching device and for storing data. According to an embodiment, the capacitor includes a plurality of contacts that are electrically connected to the switching device, exposed on the top surface of a substrate, and are arranged in a first direction and a second direction different from the first direction, and the first direction and the second direction are parallel to the substrate; mold insulators that are formed on the substrate between the contacts adjacent to one another in the first direction from among the plurality of contacts, are formed to have a predetermined thickness and have a predetermined width in the second direction, and extend in a direction vertical to the substrate; bottom electrodes that have a vertical plate-like structure, are provided on and supported by sidewalls of the mold insulators, and are electrically and respectively connected to the plurality of contacts, wherein the sidewalls of the mold insulators are perpendicular to the first direction; a dielectric layer formed on the bottom electrodes; and an upper electrode formed on the dielectric layer.

According to an embodiment, surfaces of the bottom electrodes may have uneven surface morphologies. Furthermore, the bottom electrodes may have a width corresponding to the width of the mold insulators in the second direction and a height corresponding to the height of the mold insulators in the vertical direction of the substrate.

According to an embodiment, the mold insulators may have a line pattern. According to another embodiment, the mold insulators may have a meander pattern or a wave-like pattern. Each of the bottom electrodes may include a bottom electrode pair including bottom electrodes that are provided on and supported by both sidewalls of each of the mold insulators and are electrically separated from each other. The number of the mold insulators in the first direction may be ½ of the number of memory cells in the first direction.

The bottom electrodes may contact some of surfaces of the contacts and may be electrically connected to the contacts, respectively. The switching device may include a vertical semiconductor device buried in the substrate.

A repeating unit of a memory cell structure may have an area of 2 F×4 F, and the semiconductor memory device may have a design rule of 4F2, in which two memory cells are disposed per the repeating unit. Furthermore, according to an embodiment, the semiconductor memory device may further include a supporting structure that supports between the mold insulators. According to an embodiment, the supporting structure may include reinforcing patterns extending in the first direction or lifted up from the substrate between the mold insulators.

According to another aspect of the present invention, there is provided a method of fabricating a semiconductor memory device, the method including providing a substrate having formed thereon switching devices; forming a plurality of contacts that are electrically connected to the switching device, exposed on the top surface of a substrate, and are arranged in a first direction and a second direction different from the first direction, on a surface of the substrate, wherein the first direction and second direction are parallel to the substrate; forming mold patterns that are formed on the substrate between the contacts, are a predetermined distance apart from one another in the first direction, extend in the second direction, have a predetermined height, and expose at least some of the contacts; forming a first conductive layer having a predetermined thickness on the exposed contacts and the mold patterns; forming first conductive patterns that are separated in the first direction, are supported against both sidewalls of the mold patterns, and extend in the second direction and the vertical direction by performing a first cell separating operation with respect to the first conductive layer; forming a dielectric layer on the first conductive patterns; forming mold insulation layers, bottom electrodes, and dielectric layers that are separated in the second direction by performing a second cell separating operation with respect to the mold patterns, the first conductive patterns, and the dielectric layer; and forming a second conductive layer on the dielectric layers.

According to an embodiment, the height of the first conductive patterns may correspond to the height of the mold patterns. Surfaces of the bottom electrodes may have even surface morphologies. The mold patterns may have a line pattern.

The bottom electrodes may contact some of surfaces of the contacts and may be electrically connected to the contacts, respectively. Furthermore, the thickness of the dielectric layer may be selected within a range of thicknesses sufficient to provide first trenches for forming the upper electrode between the first conductive patterns facing each other.

According to an embodiment, the method may further include forming a sacrificing layer on the dielectric layer to fill the first trenches. As the second cell separating operation is performed with respect to the mold patterns, the first conductive patterns, the dielectric layer, and the sacrificing layer in the first direction, sacrificing layer patterns may be formed and second trenches extending in the first direction may be formed between the mold insulation layers, the bottom electrodes, the dielectric layers, and the sacrificing layer patterns that are arranged in the first direction.

According to an embodiment, the method may further includes forming an insulation layer on the sacrificing layer patterns in order to fill the second trenches; and restoring the first trenches by removing the sacrificing layer patterns, wherein the second conductive layer may be formed on the dielectric layers to fill the restored first trenches.

According to an embodiment, the method may further include forming insulation layer patterns buried in the second trenches by removing portions of the insulation layer until the sacrificing layer patterns below the insulation layer are exposed, wherein the first trenches may be restored by removing the exposed sacrificing layer patterns.

According to an embodiment, the one mold pattern may be formed with respect to two every contacts arranged in the first direction and extends in the second direction.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
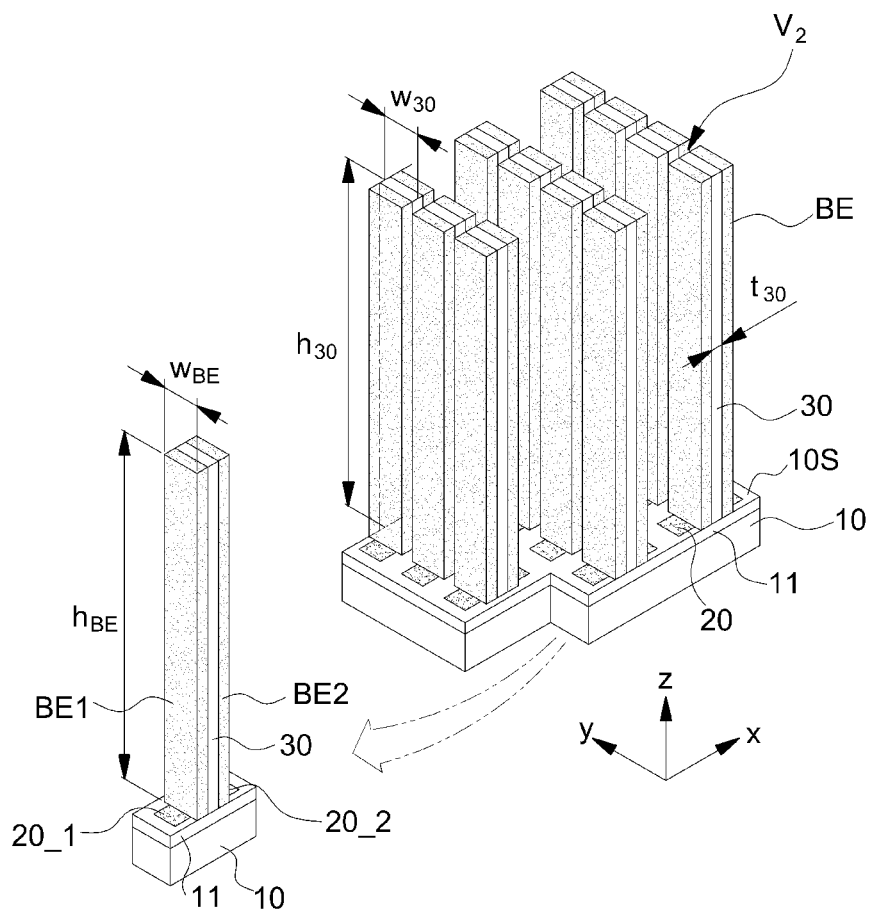
FIG. 1 is a perspective sectional diagram showing the structure of bottom electrodes of a plurality of memory cell according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Also, thickness or sizes of layers in the drawings are exaggerated for convenience of description and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" other shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is a perspective sectional diagram showing the structure of bottom electrodes BE of a plurality of memory cell according to an embodiment of the present invention.

Referring to FIG. 1, a semiconductor memory device includes a plurality of memory cells that are arranged in a first direction (x-axis direction) parallel to a substrate 10 and a second direction (y-axis direction) parallel to the substrate 10 and different from the first direction (x-axis direction). The first direction (x-axis direction) and the second direction (y-axis direction) may be perpendicular to each other or may form a different angle therebetween, such as 60° and 120°. A unit memory cell may include a switching device and a capacitor for storing data.

The switching device may be a diode or a transistor. The switching device (not shown) may be formed in the substrate 10. In examples, the diode and the transistor may be pillar-type vertical semiconductor devices including semiconductor areas with different impurity concentrations and/or different conductive types. According to an embodiment, a gate electrode may be provided in order to increase an on driving current of the switching device or switching the switching device, where the gate electrode may be disposed at a portion of side of a semiconductor area of the pillar-type semiconductor area by interposing an insulator between the gate electrode and the portion of the side of semiconductor area. The gate electrode may be coupled with a word line for accessing a selected memory cell.

An end portion of a switching device, e.g., a drain of a transistor, may be directly exposed or a conductive member electrically connected to the drain, such as a plug, a via, a pad, or a redistribution-conductive line, may be exposed on the top surface of the substrate 10. Throughout the present specification, an end of a switching device or the above-stated conductive members exposed on a surface of a substrate is/are referred to as contacts. Contacts 20 may be a constant distance apart from one another, may be respectively allocated to unit memory cells, and may have rectangular, circular, or elliptical horizontal cross-sections. However, the present invention is not limited thereto. FIG. 1 exemplifies the square contacts 20. An exposed top surface 10S of the substrate 10 around the contacts 20 is an insulating surface. The insulating surface 10S may be a surface of an interlayer insulation layer 11 provided on the substrate 10 for insulation between the contacts 20, switching devices and/or conductive lines laid under the contacts 20.

According to an embodiment, the contacts 20 may be arranged at a cell pitch of 2 feature size (F). For example, a width of the contacts 20 may be 1F, where the contacts 20 may be 1F apart from one another.

Mold insulators 30, each of which extends between the contacts 20 adjacent to each other in a second direction (y-axis direction), has a predetermined width $w_{30}$ in the second direction (y-axis direction) and a predetermined thickness $t_{30}$ in a first direction (x-axis direction), and has a predetermined height $h_{30}$ in a vertical direction (z-axis direction) of the substrate 10, are provided on the substrate 10.

As described below with reference to FIG. 4, the mold insulators 30 extending in the second direction (y-axis direction) may be arranged at every two memory cells in the first direction (x-axis direction). In this case, two memory cells may be allocated into each unit inter-cell separation layer. The mold insulators 30 may be separated by respective memory cells in the second direction (y-axis direction). In this case, gaps $V_2$ as shown in FIG. 1 may be provide between the mold insulators 30 arranged in the second direction (y-axis direction).

According to some embodiments, the gaps $V_2$ may be filled with insulation layers. According to an embodiment, each of the mold insulators 30 extending in the second direction (y-axis direction) may be arranged per one or more memory cells in the first direction (x-axis direction), where the insulation layers filling the gaps $V_2$ may be combined with one another and constitute an inter-cell separating layer. The insulation layers filling the gaps $V_2$ may be an insulation layer (IL' of FIG. 4) that extends in the first direction (x-axis direction) and is disposed between memory cells arranged in the second direction (y-axis direction).

According to an embodiment, a supporting structure extending in the first direction (x-axis direction) may be further provided between the mold insulators 30, thereby preventing a defect due to inclination of the mold insulators 30 during formation of the mold insulators 30.

Bottom electrodes BE may be provided on a sidewall of the mold insulators 30, respectively. The bottom end of the bottom electrode BE contacts at least a portion of the contact 20 of a corresponding memory cell, thereby establishing an electric connection between the bottom electrode BE and the contact 20.

As shown in FIG. 1, the bottom electrodes BE may be provided and supported on both the sidewalls perpendicular to the first direction (x-axis direction), respectively of the mold insulators 30. In this case, bottom electrodes $BE_1$ and $BE_2$ of two memory cells may be supported by the single mold insulator 30. In this example, the number of the mold insulators 30 in the first direction (x-axis direction) may be ½ of the number of memory cells arranged in the first direction (x-axis direction). In the present specification, the two bottom electrodes $BE_1$ and $BE_2$ that are formed on the both side surfaces of the mold insulator 30 to share the single mold insulator 30 may be referred to as a 'bottom electrode pair'. According to an embodiment, switching devices connected to the bottom electrode pair may share a single bit line together. In this case, the bit line may be a buried bit line that extends in the second direction (y-axis direction) below the mold insulators 30.

According to another embodiment, a switching devices connected a bottom electrode of any one bottom electrode pair and a bottom electrode of other bottom electrode pair from among bottom electrode pairs adjacent to each other may share a bit line. In this case, the bit line may be a buried bit line that extends in the second direction (y-axis direction) from the center region between the mold insulators 30 adjacent to one another. The directions of bit lines and the combinations of memory cells stated above are merely examples, and the present invention is not limited thereto.

The bottom electrodes BE are supported and electrically separated by the mold insulators 30 and function as bottom electrodes of corresponding memory cells, respectively. According to an embodiment, as shown in FIG. 1, each of the bottom electrodes BE may have a width $W_{BE}$ and a height $h_{BE}$ corresponding to the width $W_{30}$ and the height $h_{30}$ of the mold insulators 30, respectively. Throughout the present specification, the expression "A corresponding to B" refers to that A is substantially identical to B or approximately B with a possible tolerance that may occur based on heights and/or profiles of other structures below the mold insulators 30 and the bottom electrode BE, e.g., the interlayer insulation layer 11 or the contacts 20. Even when an actual height difference occurs due to a difference between structures below the mold insulators 30 and the bottom electrodes BE, the top end portions of the mold insulators 30 and the top end portions of the contacts 20 may be identical to each other.

The mold insulators 30 and the bottom electrodes BE having lengths and widths corresponding to each other may be fulfilled through a patterning process for forming the mold insulators 30 and the bottom electrodes BE, where detailed description thereof will be below. A first surface of the bottom electrode BE is supported by the mold insulators 30, second surface of the bottom electrodes BE is exposed, and dielectric layers and upper electrodes are sequentially stacked on the exposed second surface of the bottom electrode BE.

According to an embodiment, height $h_{BE}$ of the bottom electrode BE may be increased by increasing height $h_{30}$ of the mold insulators 30. Therefore, as the bottom electrodes BE are supported by the mold insulators 30, the bottom electrodes BE may be mechanically stabilized, may have increased height with certain width, and may have an overall vertical plate-like structure.

As known in the art, surfaces of the bottom electrodes BE may be flat or may include hemisphere-shaped grains (HSGs), quantum dots, or micro-crystals to increase the surface area of the bottom electrodes BE, and thus the surfaces of the bottom electrodes BE may have uneven surface morphologies According to an embodiment, the width $W_{30}$ and the thickness $t_{30}$ of the mold insulators 30 may be 1.5 F and 0.5F, respectively. In this case, the width $W_{BE}$ of the bottom electrodes BE may be 1.5 F, whereas the thickness $t_{BE}$ of the bottom electrodes BE may be a predetermined thickness, e.g., 0.5 F, for electrical contact with the contacts 20. As described above, dielectric layers and upper electrodes may be sequentially formed on the exposed surfaces of the bottom electrodes BE. Even when the thickness $t_{30}$ of the mold insulators 30 is 0.5 F, a gap of 3.5 F may be secured between the mold insulators 30. Furthermore, even when upper electrodes having thickness of 0.5F are disposed, height of the bottom electrodes BE may be increased by using high-k dielectrics having thickness of even 1 F, thereby providing a capacitor that suppresses leakage current and has sufficient capacitance. The above-stated sizes are merely examples, and suitable sizes may be selected in order to suppress or reduce leakage current and insulation breakdown of the dielectric layers according to designed capacitance.

FIGS. 2A through 2L are perspective sectional diagrams showing a method of fabricating the semiconductor memory device 100 according to an embodiment of the present invention. Descriptions of components having reference numerals identical to those of the above-stated components may be similar or identical to the descriptions of the above-stated components given above unless being contradictory.

Figure 2A:
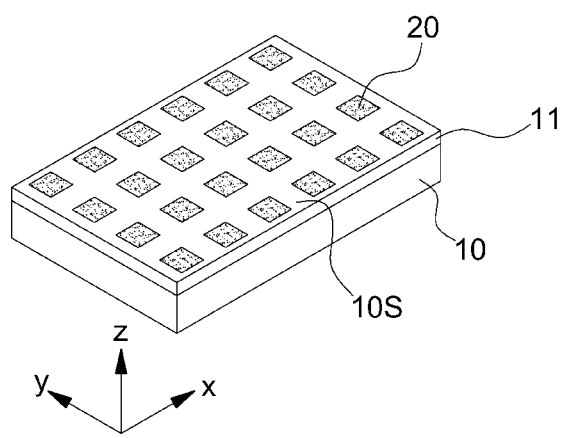
FIGS. 2A through 2L are perspective sectional diagrams showing a method of fabricating a semiconductor memory device according to an embodiment of the present invention.

Referring to FIG. 2A, the substrate 10 is provided. In the substrate 10, the above-stated switching devices for accessing respective memory cells may be formed in the substrate 10. The switching devices may be connected to word lines and bit lines, respectively.

The contacts 20 may be formed on the surface 10S of the substrate 10. The surface 10S of the substrate 10 except the contacts 20 may be an insulating surface. The insulating surface may be provided by the interlayer insulation layer 11 that exposes surfaces of the contacts 20 and surrounds the contacts 20. The interlayer insulation layer 11 may include a silicon oxide or a silicon nitride. However, the present invention is not limited thereto.

The contacts 20 may be 2-dimensionally arranged to have predetermined intervals apart from one another in the first direction (x-axis direction) and the second direction (y-axis direction) that are parallel to the surface 10S of the substrate 10. The first direction (x-axis direction) and the second direction (y-axis direction) may be perpendicular to each other or may form a different angle therebetween, such as 60° and 120°. Bitlines may extend in the first direction (x-axis direction), whereas wordlines may extend in the second direction (y-axis direction). Alternatively, wordlines may extend in the first direction (x-axis direction), whereas bitlines may extend in the second direction (y-axis direction).

The contacts 20 may include doped silicon, a metal, such as titanium, tantalum, ruthenium, and tungsten, a conductive nitride of the metal, or a conductive oxide of the metal. However, the present invention is not limited thereto. Furthermore, the contacts 20 may have size of 1 $F^2$.

Figure 2B:
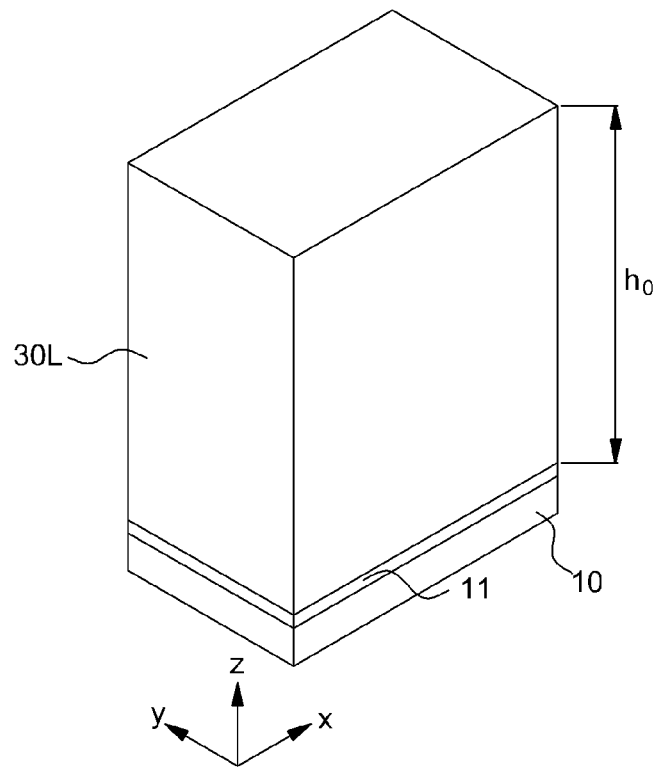

Referring to FIG. 2B, a first insulation layer 30L may be formed on the substrate 10. Height ho of the first insulation layer 30L may correspond to the designed height hBE of the above-stated bottom electrode (BE of FIG. 1). The first insulation layer 30L may include a silicon oxide or a silicon nitride. In an embodiment, the first insulation layer 30L may include an insulator of a different type having an etching selectivity with respect to the interlayer insulation layer 11 of FIG. 2A. For example, when the interlayer insulation layer 11 includes a silicon oxide, the first insulation layer 30L may include a silicon nitride. Furthermore, according to another embodiment, an etch-stop film (not shown) for protecting the contacts 20 during an operation for patterning the first insulation layer 30L before the formation of the first insulation layer 30L may be formed. In this case, the first insulation layer 30L and the interlayer insulation layer 11 may include an identical insulating material. The above-stated insulators for forming the first insulation layer 30L and the interlayer insulation layer 11 are merely examples, and embodiments of the present invention are not limited to the examples.

Figure 2C:
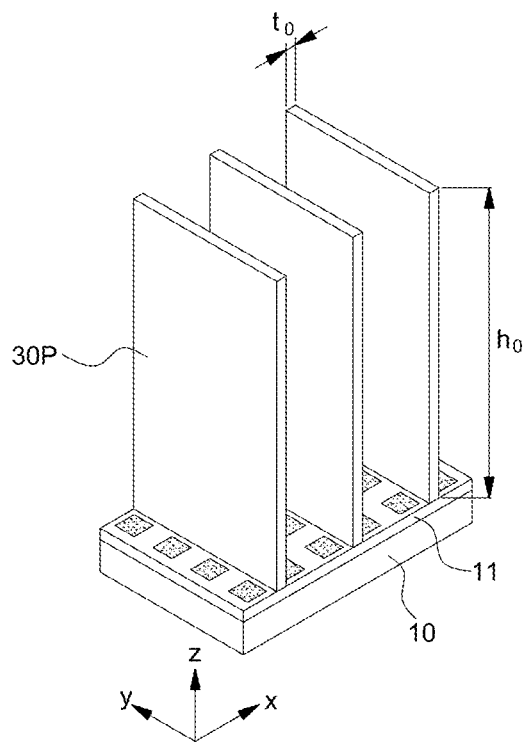

Referring to FIG. 2C, mold patterns 30P may be formed by patterning the first insulation layer 30L. The mold patterns 30P are formed between the contacts 20 and expose at least some of surfaces of the contacts 20. FIG. 2C shows that all of the surfaces of the contacts 20 are exposed. The mold patterns 30P may be formed on an insulating surface of the substrate 10, e.g., the interlayer insulation layer 11.

According to an embodiment, as shown in FIG. 2C, the mold patterns 30P may have a line-and-space pattern (hereinafter referred to as a line pattern). To this end, a mask layer including a line pattern extending in the second direction (y-axis direction) may be formed on the first insulation layer 30L via a photolithography operation, and the mold patterns 30P having line patterns that extend in the second direction (y-axis direction) and are separated by a predetermined interval from one another in the first direction (x-axis direction) may be formed by performing an etching operation using the mask layer as an etch mask, e.g., a reactive ion etching operation using plasma. Throughout the present specification, the term 'line' is not limited to a straight line and includes non-straight lines that continuously extend in the second direction (y-axis direction), e.g., a wave line, a meander line, or a zigzag line. According to an embodiment, when the etch-stop layer is formed on the substrate 10, an operation for removing the etch-stop layer at areas which do not have the mold patterns 30P may be performed in order to expose surfaces of the mold insulators 30 after the mold patterns 30P are formed.

The height ho of the mold patterns 30P may be identical to the height of the first insulation layer 30L, whereas the thickness to of the mold patterns 30P may be a thickness sufficient to expose at least some of surfaces of the contacts 20, e.g., 0.5 F. Accordingly, when the thickness to of the mold patterns 30P is 0.5 F, the contacts 20 may be completely exposed between the mold patterns 30P.

According to an embodiment, as shown in FIG. 2C, each of the mold patterns 30P having the line patterns may be formed with respect to every two of the contacts 20 arranged in the first direction (x-axis direction), and may extend in the second direction (y-axis direction). Therefore, the configuration in which any one of the mold insulators (30 of FIG. 1) is shared by the bottom electrodes BE of two memory cells adjacent to each other in the first direction (x-axis direction) may be fulfilled.

Figure 2D:
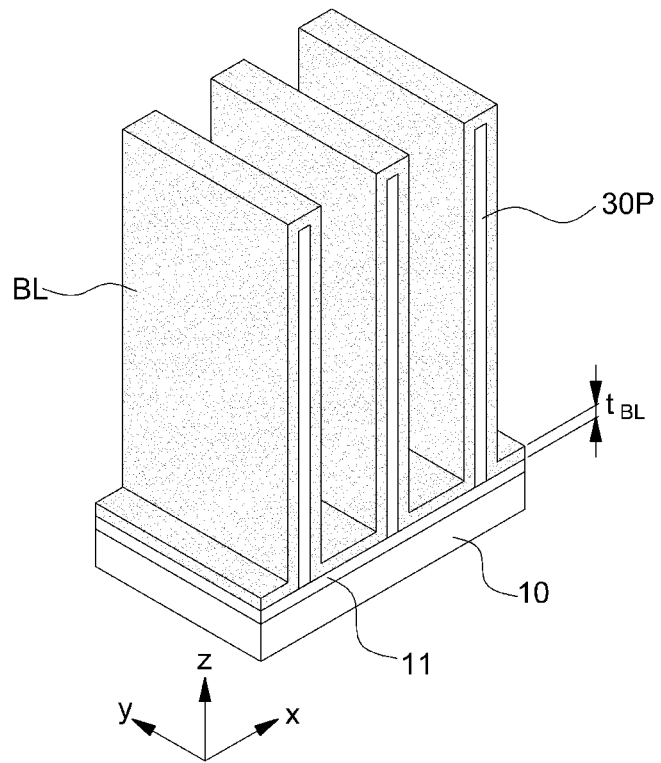

Referring to FIG. 2D, a first conductive layer BL having a constant thickness is formed on the exposed contacts 20 and the mold patterns 30P. The first conductive layer BL may include one, stack of two layer, or mixture selected from platinum (Pt), tungsten (W), gold (Au), palladium (Pd), rhodium (Rh), iridium (Ir), ruthenium (Ru), tantalum (Ta), molybdenum (Mo), chromium (Cr), vanadium (V), titanium (Ti), aluminum (Al), copper (Cu), silver (Ag), nickel (Ni), manganese (Mn), tin (Sn), an alloy thereof, a nitride thereof, an oxide thereof, graphite, carbon nano-tube, and fullerene.

The first conductive layer BL may be formed via chemical vapor deposition or atomic layer deposition in which the first conductive layer BL may be conformally deposited onto the mold patterns 30P having a high aspect ratio. According to an embodiment, thickness $t_{BL}$ of the first conductive layer BL may be about 0.5 F, where the thickness tBL may be smaller than or greater than 0.5 F and may be designed so that the first conductive layer BL may contact the contacts 20 therebelow in a consequent patterning operation. Furthermore, the thickness tBL of the first conductive layer BL may be designed to secure a sufficient space for depositing a dielectric layer (DL of FIG. 2F) and a second conductive layer (UE of FIG. 2L) for upper electrodes that are sequentially formed on the first conductive layer BL between the mold patterns 30P.

Figure 2E:
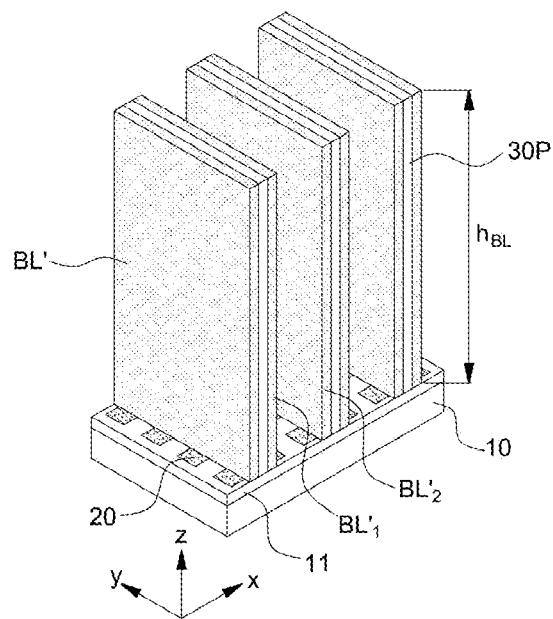

Referring to FIG. 2E, a first cell separating operation may be performed with respect to the first conductive layer BL in the first direction (x-axis direction), thereby forming first conductive patterns BL' separated in the first direction (x-axis direction). The first conductive patterns BL' may be supported against both sidewalls of the mold patterns 30P and extend in the second direction (y-axis direction) and the third direction (z-axis direction). Height $h_{BL}$ of the first conductive patterns BL' may correspond to the height ho of the mold patterns 30P. The first cell separating operation may include an etchback operation based on an anisotropic etching operation, such as a reactive ion etching operation. The anisotropic etching operation may be performed with respect to the first conductive layer BL until the top surfaces of the mold patterns 30P are exposed and portions of the first conductive patterns BL' between the mold patterns 30P adjacent to one another are removed.

The bottom portion of the first conductive patterns BL' formed in the first cell separating operation may respectively contact at least some of the surfaces of the contacts 20 arranged in the second direction (y-axis direction) and may be electrically connected to the contacts 20. Contacting areas of the first conductive patterns BL' contacting the contacts 20 may be adjusted based on the thickness to and pitch of the mold patterns 30P and the thickness tBL of the first conductive layer BL.

Figure 2F:
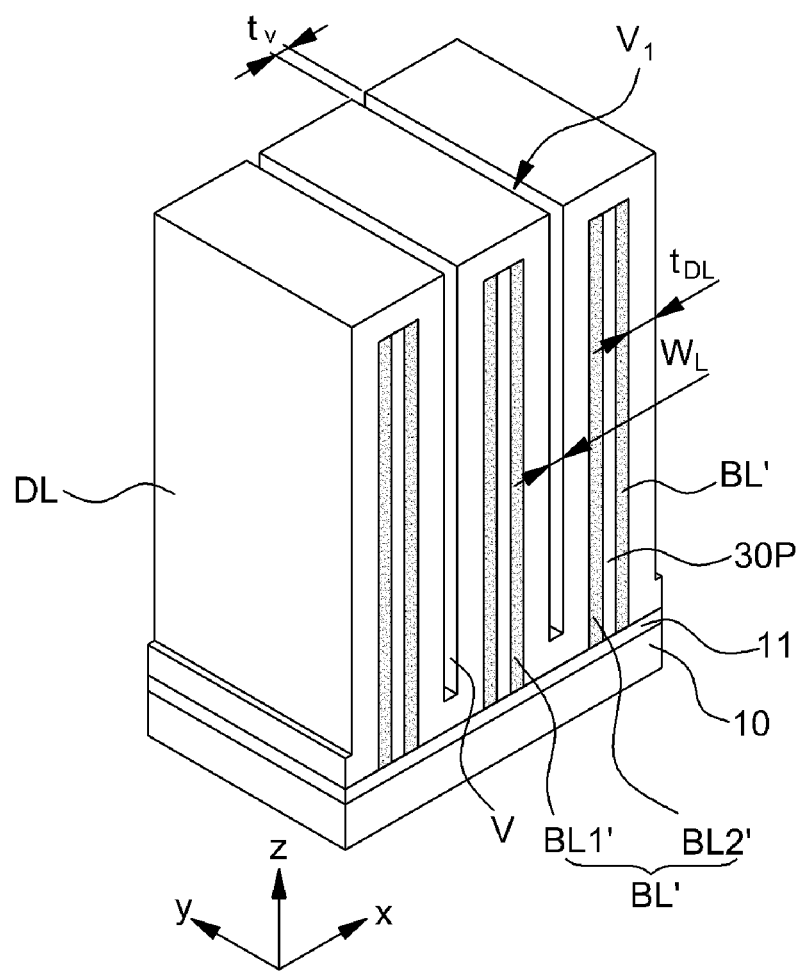

Referring to FIG. 2F, a dielectric layer DL is formed on the first conductive patterns BL'. The dielectric layer DL may be formed in a deposition operation with excellent step coverage. For example, the dielectric layer DL may be formed in a chemical vapor deposition operation or an atomic layer deposition operation.

The dielectric layer DL may include a silicon oxide or a high-k dielectric layer. The high-k dielectric layer may include silicon nitride layer, silicon oxide layer, hafnium oxide layer, zirconium oxide layer, tantalum oxide layer, titanium oxide layer, hafnium aluminum oxide layer, hafnium tantalum oxide layer, hafnium silicon oxide layer, aluminum oxide layer, aluminum nitride layer, aluminum gallium layer, or a combination thereof. However, the above-stated materials are merely examples, and embodiments of the present invention are not limited thereto.

Thickness $t_{DL}$ of the dielectric layer DL may be selected within a range of thicknesses to provide a first trench $V_1$ for forming a second conductive layer (for upper electrode UE of FIG. 2L) therein between first conductive patterns BL1' and BL2' facing each other in order to secure a sufficient upper electrode area, where the thickness $t_{DL}$ of the dielectric layer DL may be secured to be sufficiently large. For example, when a distance between the first conductive patterns BL1' and BL2' is 2.5 F, the first trench $V_1$ having a width $W_L$ of 0.5 F may be formed even if the thickness $t_{DL}$ of the dielectric layer DL is 1 F, and thus the second conductive layer UE for an upper electrode may be easily formed. From other point of view, according to an embodiment, since the thickness $t_{DL}$ of the dielectric layer DL may be enlarged to be equal to or greater than 1 F, for example, a sufficient physical thickness of the dielectric layer DL may be obtained, and thus defects of a capacitor due to leakage current and insulation breakdown may be alleviated. As described above, even when the thickness of the dielectric layer DL increases, the height $h_{BL}$ of the bottom electrode BE may be increased by increasing the height $h_{30}$ of the mold insulator 30, thereby compensating reduction of permittivity due to increased thickness of the dielectric layer DL.

Figure 2G:
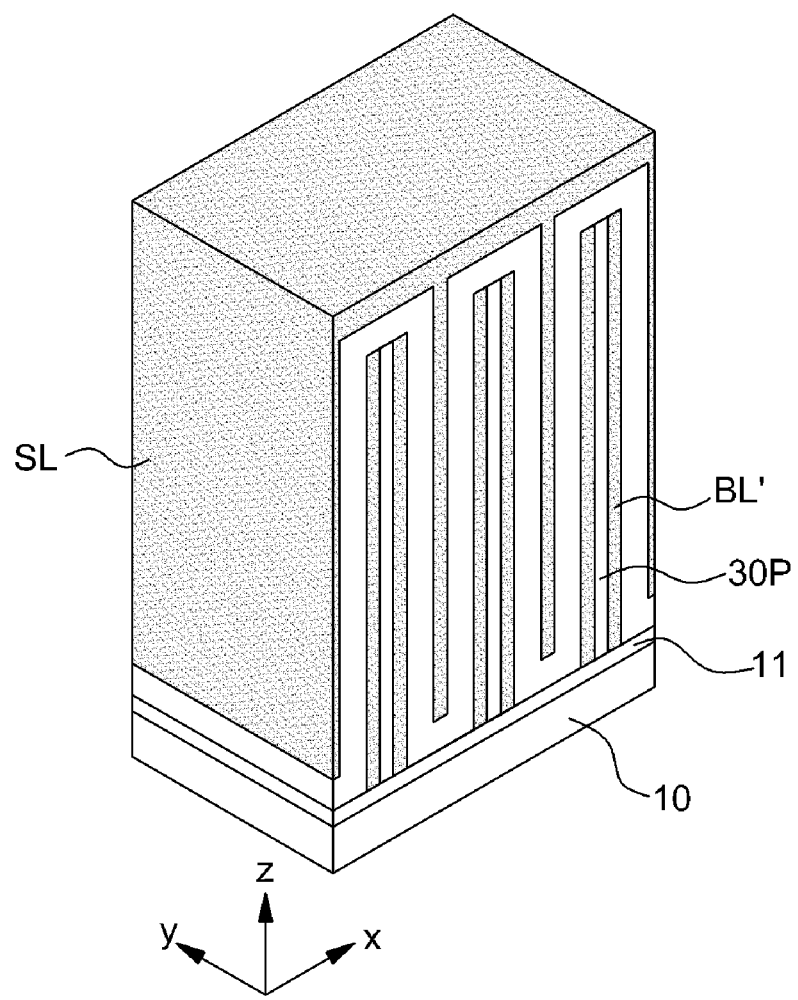

Referring to FIG. 2G, according to an embodiment, a sacrificing layer SL may be formed on the dielectric layer DL to fill the first trench $V_1$. The sacrificing layer SL is a layer for restoring the first trench $V_1$ between memory cell adjacent to each other in the first direction (x-axis direction) in a subsequent operation and is a temporary structure for securing an area for forming an upper electrode (which is a common electrode) of a capacitor. The sacrificing layer SL may include any suitable insulator. For example, the sacrificing layer SL may include a silicon nitride or a silicon oxide. However, the present invention is not limited thereto.

Figure 2H:
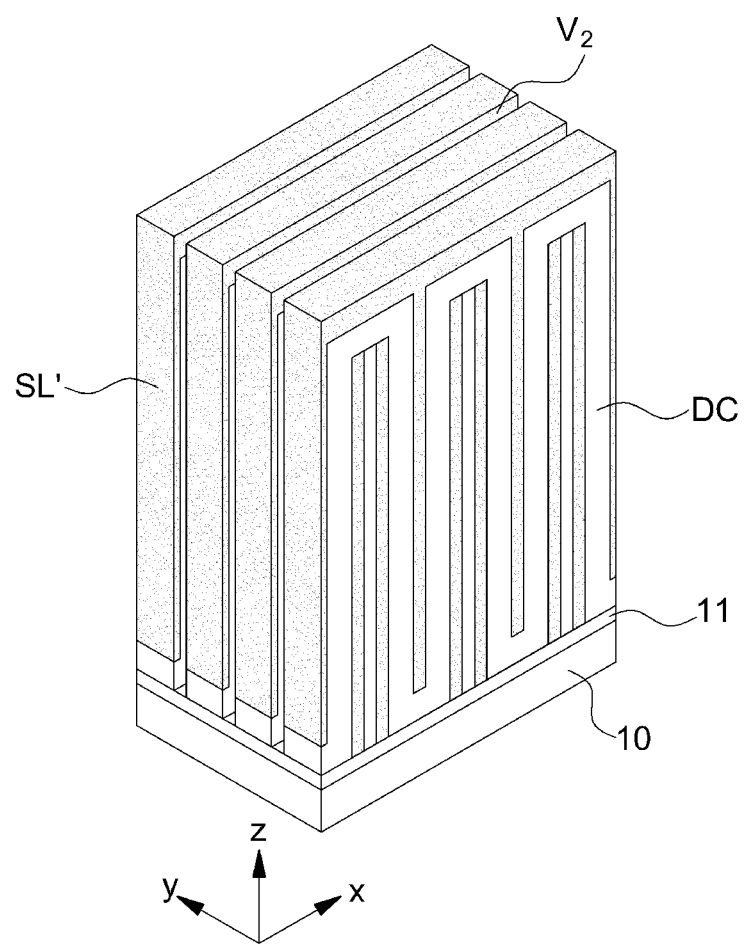

Referring to FIG. 2H, a second cell separating operation may be performed in the second direction (y-axis direction) with respect to the mold patterns 30P, the first conductive patterns BL', and the dielectric layer DL formed on the substrate 10. The second cell separating operation may be performed by forming trenches $V_2$ extending in the first direction (x-axis direction) between the contacts 20 that are arranged in the second direction (y-axis direction). The trenches $V_2$ may be the gaps $V_2$ described above with reference to FIG. 1.

The second cell separating operation may be performed by forming a mask layer including a line pattern extending in the first direction (x-axis direction) via a photolithography operation and etching result structures thereof until the surface 10S of the substrate 10 is exposed, for example, via an anisotropic etching operation, such as a reactive ion etching operation using plasma. According to an embodiment, as shown in FIG. 2G, when the sacrificing layer SL is formed, the mask layer having a line pattern may be formed on the sacrificing layer SL.

The mold patterns 30P, the first conductive patterns BL', the dielectric layer DL, and, selectively, the sacrificing layer SL are separated in the second direction (y-axis direction) by the second cell separating operation. As a result, the mold insulator (30 of FIG. 1) may be formed from the mold patterns 30P, the bottom electrode BE are formed from the first conductive patterns BL', dielectric layers DC are formed from the dielectric layer DL, and, selectively, sacrificing layer patterns SL' are formed from the sacrificing layer SL. Furthermore, by the second cell separating operation, the second trenches $V_2$ extending in the first direction (x-axis direction) may be formed between the mold insulators 30, the bottom electrodes BE, and the dielectric layers DC that are arranged in the first direction (x-axis direction) or between the contacts 20 arranged in the first direction (x-axis direction).

Figure 2I:
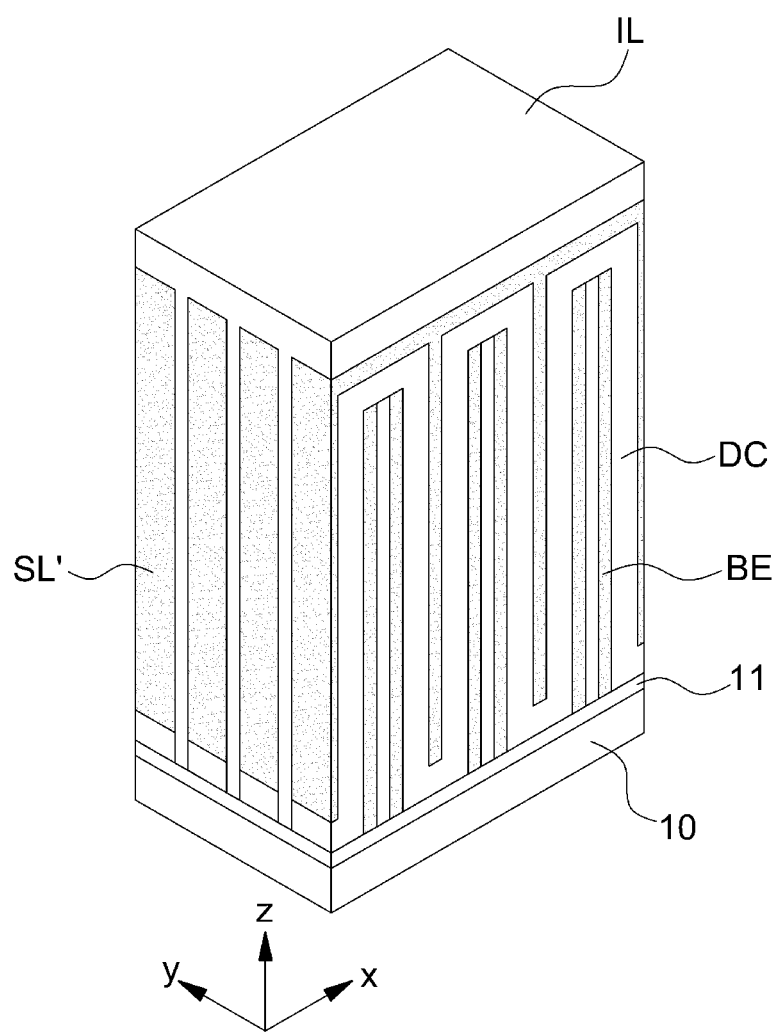

Referring to FIG. 2I, an insulation layer IL may be formed on the sacrificing layer patterns SL' that are separated to fill the second trenches $V_2$. The insulation layer IL may include a material having an etching selectivity with respect to the sacrificing layer patterns SL'. For example, when the sacrificing layer patterns SL' include a silicon nitride, the insulation layer IL may include a silicon oxide. Furthermore, according to an embodiment, the insulation layer IL may include a same material as the first insulation layer (30L of FIG. 2B) for forming the mold patterns 30P.

Figure 2J:
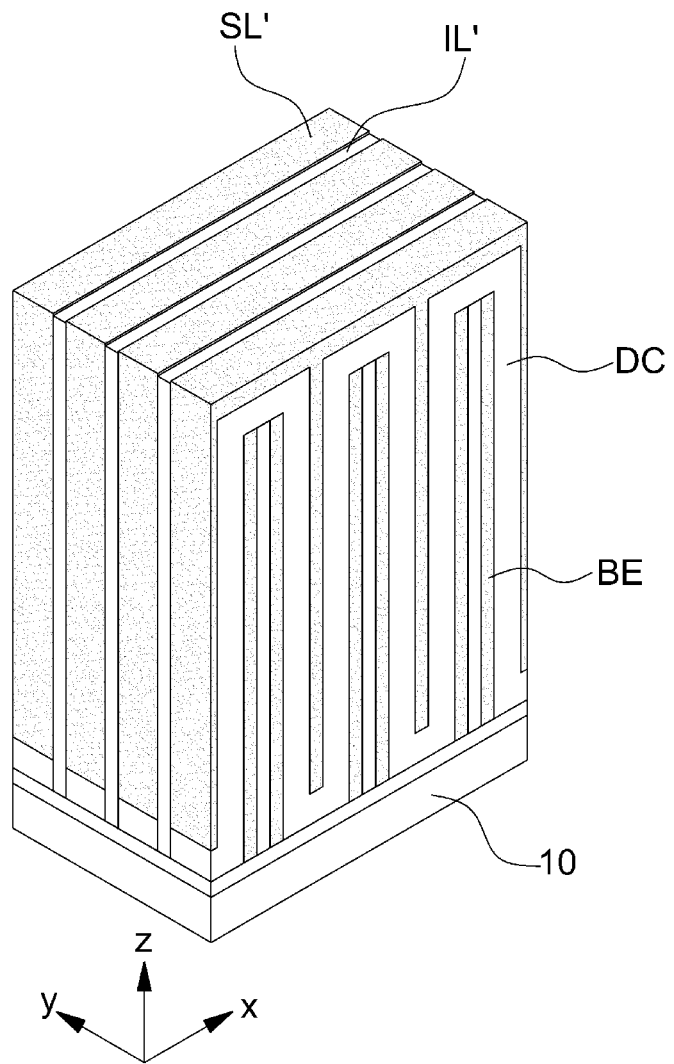

Referring to FIG. 2J, a portion of the insulation layer IL may be removed until the sacrificing layer patterns SL' therebelow is exposed, thereby forming insulation layer patterns IL' buried in the second trenches $V_2$. The insulation layer patterns IL' may function as cell separating layers for separating memory cells in the first direction (x-axis direction).

Figure 2K:
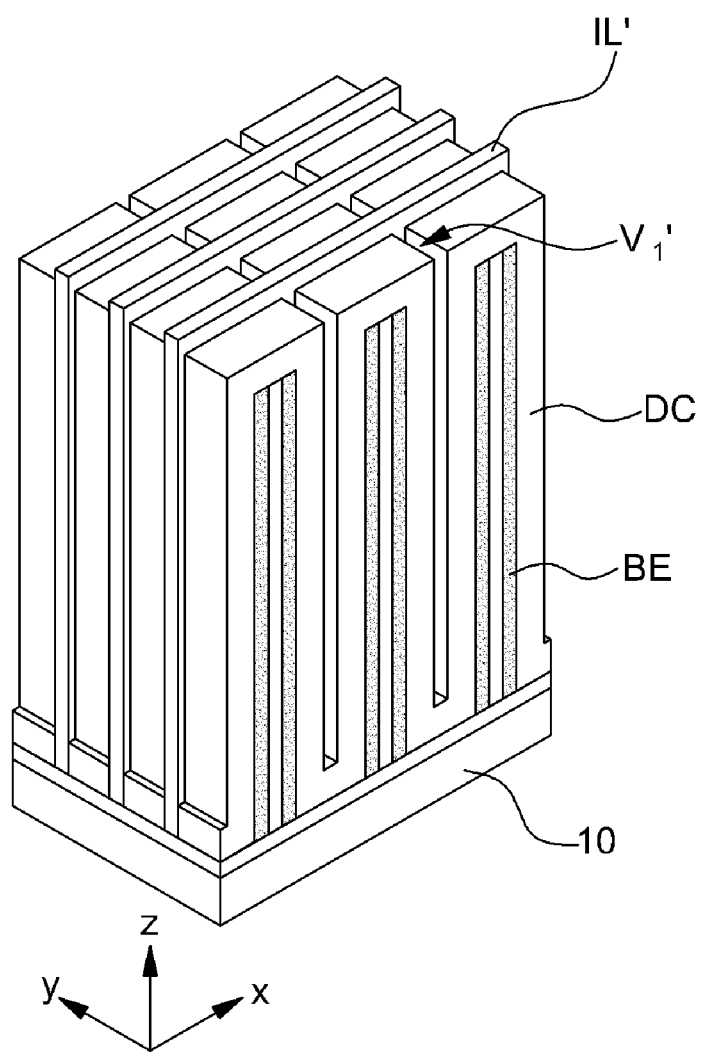

Next, referring to FIG. 2K, the exposed sacrificing layer patterns SL' may be removed. The sacrificing layer patterns SL' may be removed by using an etching selectivity between the insulation layer patterns IL' and the underlying dielectric layer DC. The exposed sacrificing layer patterns SL' may be removed via a wet etching operation or an etchback dry etching operation. However, the present invention is not limited thereto. As the exposed sacrificing layer patterns SL' are removed, first trenches $V_1'$ between the dielectric layers DC are restored or exposed between the bottom electrodes BE adjacent to each other in the first direction (x-axis direction).

Unlike the first trench $V_1$ of FIG. 2F, the restored first trench $V_1'$ may be cut cell-by-cell by the insulation layer patterns IL' in the second direction (y-axis direction). As a result, the mold insulators 30, the bottom electrodes BE, and the dielectric layers DC formed on the substrate 10 may be singulated (or isolated) on the x-y plane.

Figure 2L:
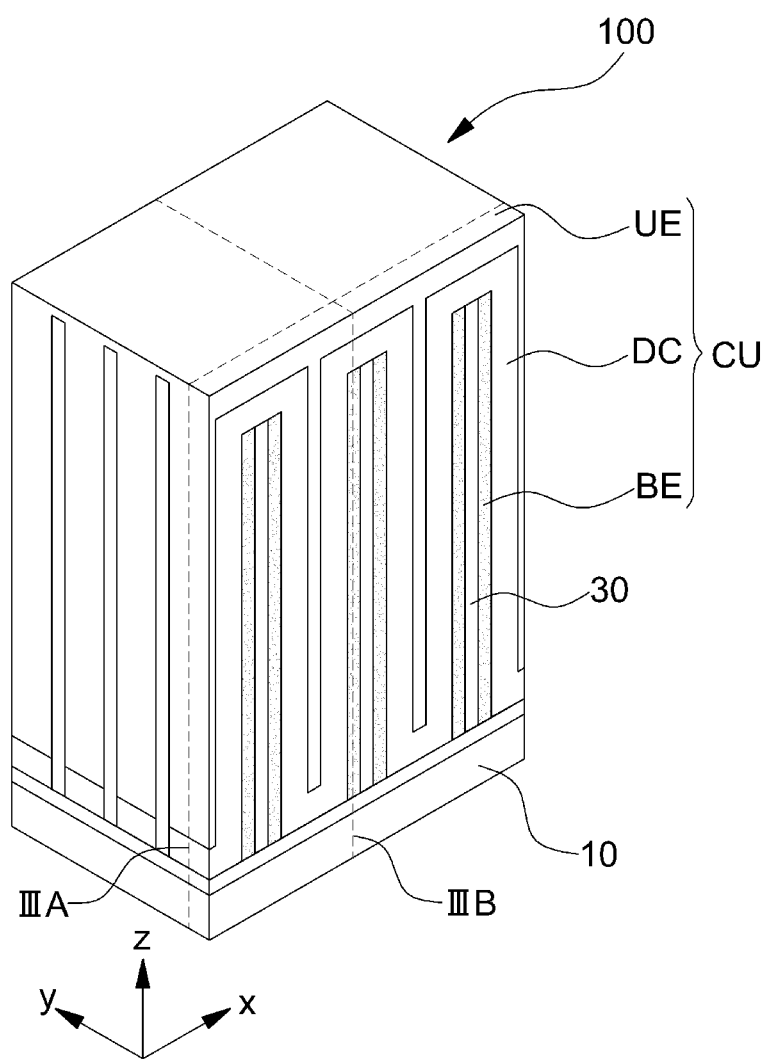

Referring to FIG. 2L, a second conductive layer UE, which will become an upper electrode, may be formed on the dielectric layers DC to fill the restored first trench $V_1'$. Via a patterning operation for maintaining a portion of the second conductive layer UE within a memory cell area, an upper electrode UE may be provided as a plate electrode as a common electrode. As a result, an array of capacitors CU including flat panel-like bottom electrodes BE that are supported by the mold insulators 30, the dielectric layers DC, and the upper electrode UE as a common electrode, are electrically connected to the contacts 20 may be provided on the substrate 10.

Although the sacrificing layer SL may be formed as shown in FIG. 2G in order to secure the first trench $V_1$ in the above embodiment, the present invention is not limited thereto. According to another embodiment, instead of the sacrificing layer SL, a second conductive layer, which will become an upper electrode that fills the first trench $V_1$, may be directly formed, and then the second cell separating operation for separating the mold patterns 30P, the first conductive patterns BL', the dielectric layer DL, and the second conductive layer in the second direction (y-axis direction) may be performed. The second cell separating operation may be performed by forming the trenches $V_2$ extending in the first direction (x-axis direction) between contacts arranged in the second direction (y-axis direction). Here, the trenches $V_2$ may be the gaps $V_2$ described above with reference to FIG. 1.

Figure 3A:
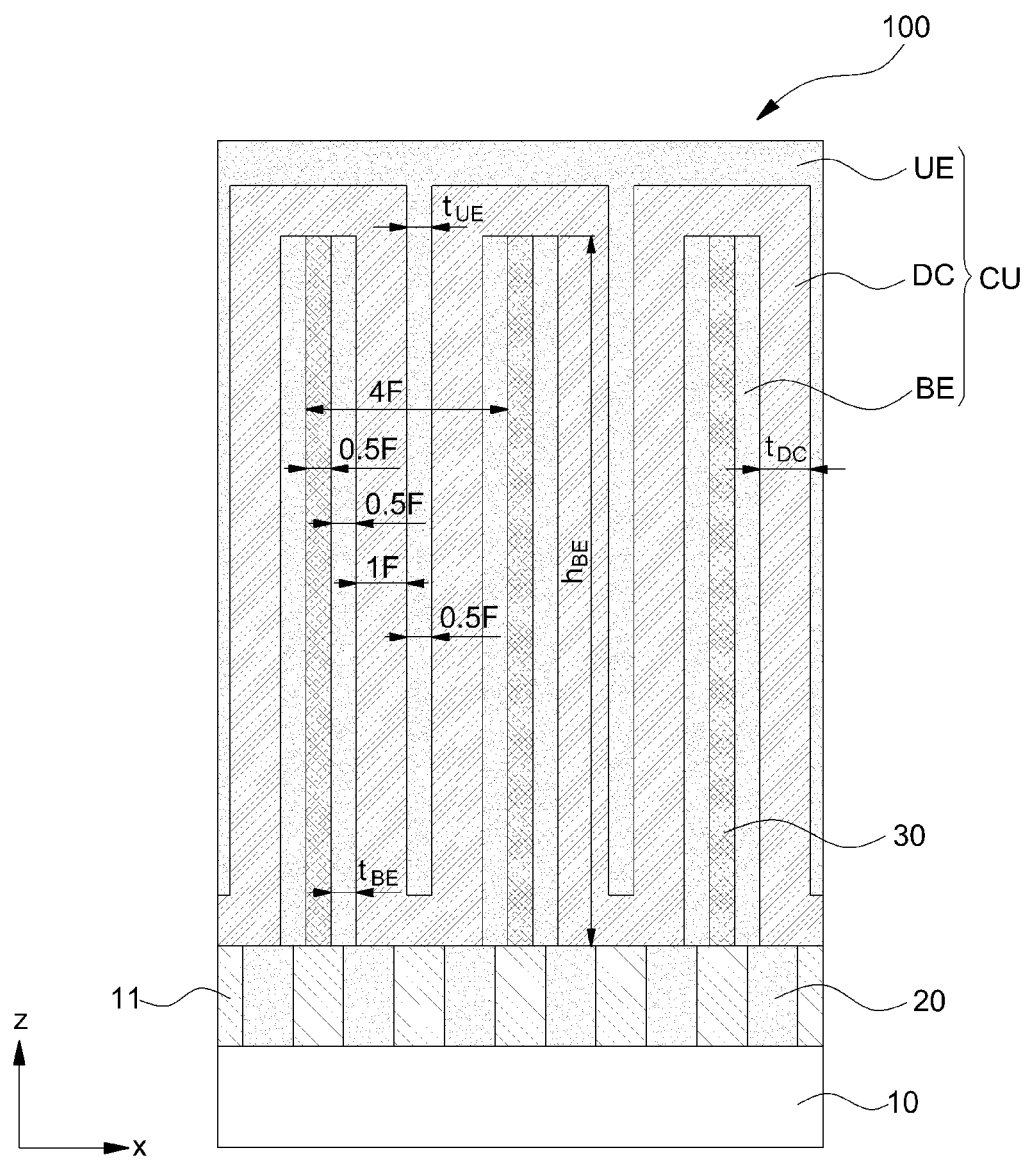
FIGS. 3A and 3B are sectional views of a capacitor of the semiconductor memory device according to an embodiment of the present invention.
Figure 3B:
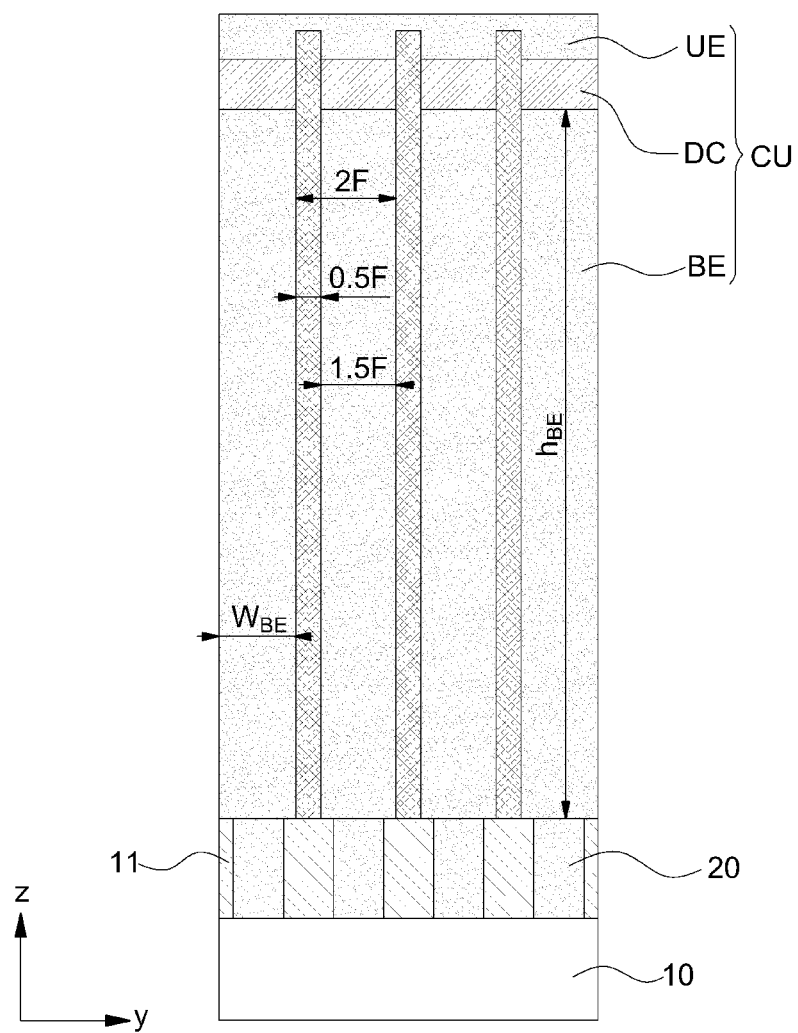

FIGS. 3A and 3B are sectional views of a capacitor CU of the semiconductor memory device 100 according to an embodiment of the present invention. FIG. 3A is a sectional view of the capacitor CU, taken along a line IIIA of FIG. 2L, whereas FIG. 3B is a sectional view of the capacitor CU, taken along a line IIIB of FIG. 2L. FIG. 4 is a top transparent view of a capacitor of the semiconductor memory device 100 according to an embodiment of the present invention.

Referring to FIGS. 3A and 3B, when the mold insulators 30 of the semiconductor memory device 100 are designed to have a thickness of 0.5 F, a distance between the mold insulators 30 in the first direction (x-axis direction) may be 3.5 F. The bottom electrodes BE attached to and supported by both side surfaces of the mold insulators 30 have a vertical plate (VP)-like shape having the width $W_{BE}$ of 1.5 F in the second direction (y-axis direction). When it is assumed that the thickness $t_{BE}$ of the bottom electrodes BE is 0.5 F, a distance between the two bottom electrodes BE adjacent to each other may be 2.5 F. Therefore, even when thickness $t_{UE}$ of upper electrodes UE is 0.5 F, there is still a distance of 2 F between the two bottom electrodes BE adjacent to each other in the first direction (x-axis direction), and thus thickness $t_{DC}$ of the dielectric layer DC may be increased up to 1 F. Accordingly, a cell design in which the thickness $t_{DC}$ of the dielectric layer DC may be increased is an advantage of embodiments of the present invention compared to a conventional cylindrical bottom electrode structure.

Furthermore, bottom electrodes having a vertical plate-like shape as described above are not self-sustained structures and are supported by the mold insulators 30 that are formed at an early stage of a process for fabricating a semiconductor memory device, thereby providing significantly improved structural stability as compared to conventional node-type bottom electrodes, e.g., cylindrical bottom electrodes. Therefore, according to embodiments of the present invention, the height $h_{BE}$ of the bottom electrodes BE may be increased as much as the height of the mold insulators 30 is increased.

In terms of capacitance, referring to FIG. 3B, according to an embodiment, the width $W_{BE}$ of the bottom electrodes BE may be 1.5 F. Since each of the bottom electrodes BE according to an embodiment of the present invention uses only one exposed surface as an electrode area, the area of the bottom electrode of a unit memory cell is $1.5F \times h_{BE}$. A same electrode area as that of a relative capacitor that uses both side surfaces of bottom electrodes may be obtained by multiplying the height by 2/1.5 times, compared to a bottom electrode having a width of 1F. For example, when the height of bottom electrodes of a capacitor using both side surfaces of the bottom electrodes is 200 nm, bottom electrodes of a capacitor according to an embodiment may have the height of 267 nm to secure the same electrode area. In this case, according to an embodiment, unlike in a case where bottom electrodes are standing alone, the bottom electrodes are supported by mold insulators, and thus the height of the bottom electrodes may be increased. As a result, a same bottom electrode area may be obtained by using only one of two surfaces of the bottom electrode.

Figure 4:
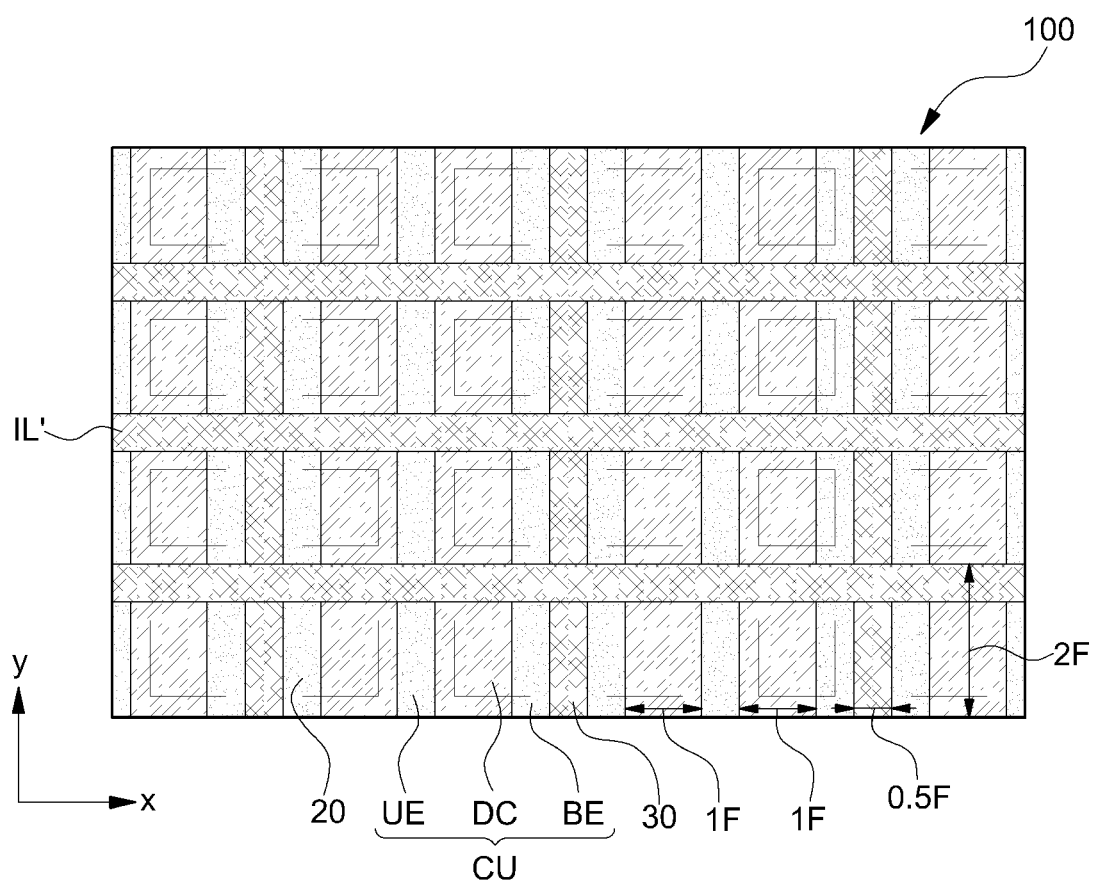
FIG. 4 is a top transparent view of a capacitor of the semiconductor memory device according to an embodiment of the present invention.

Referring to FIG. 4, in a semiconductor memory device according to an embodiment of the present invention, a location relationship between the contacts 20 and the capacitor CU on the substrate 10 may be recognized. According to an embodiment, a repeating unit of a memory cell structure may have an area of 2 F×4 F. When two memory cells are arranged per repeating unit, a semiconductor memory device having a design rule of 4F2 available area per unit memory cell, may be provided. Furthermore, according to an embodiment of the present invention, since two capacitors are surrounded by mold insulators and an insulation layer, a stable memory cell which may improve structural stability and suppress electric interference between other adjacent memory cells may be provided.

Figure 5A:
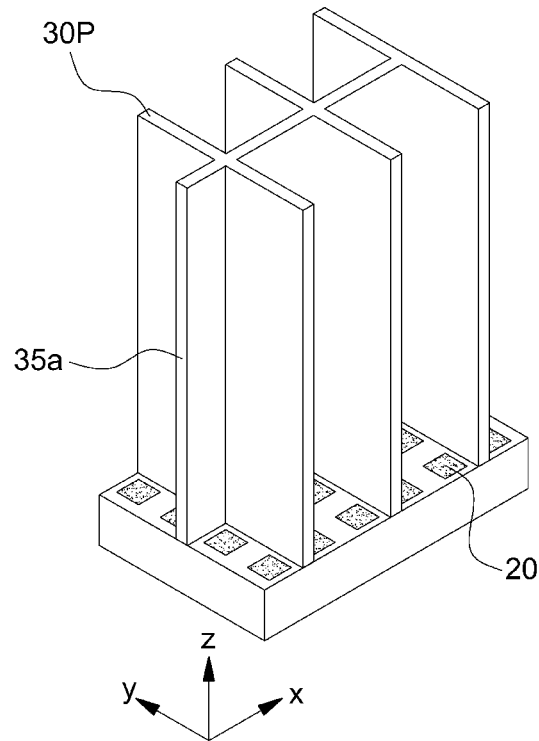
FIGS. 5A and 5B are perspective diagrams showing methods of fabricating semiconductor memory devices according to other embodiments of the present invention, respectively.
Figure 5B:
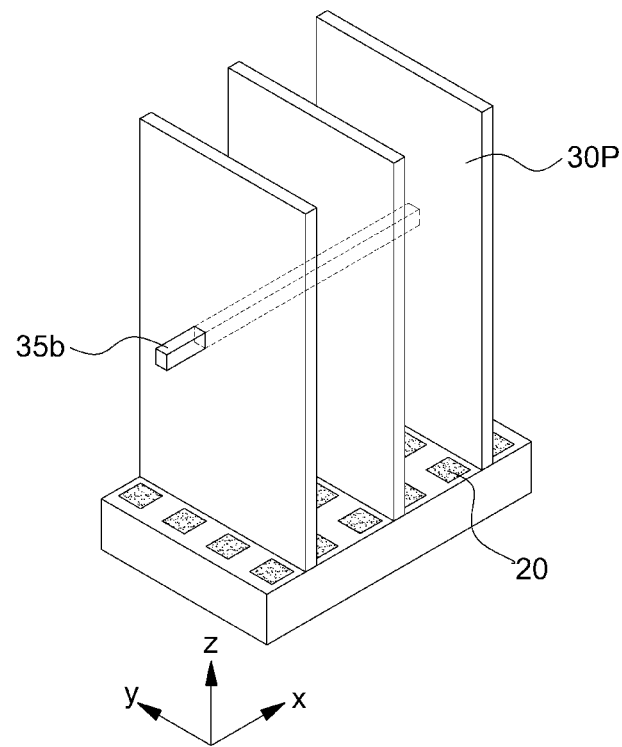

FIGS. 5A and 5B are perspective diagrams showing methods of fabricating semiconductor memory devices according to other embodiments of the present invention, respectively.

During fabrication of a semiconductor memory device, additional supporting structures may be formed to improve structural stability of the mold patterns 30P formed on the substrate 10. For example, as shown in FIG. 5A, in order to prevent a defect, such as inclination of the mold patterns 30P that are line patterns apart from one another in the first direction (x-axis direction), reinforcing patterns 35a extending in the first direction (x-axis direction) may be further formed as the supporting structures between the mold patterns 30P.

In an embodiment, the reinforcing patterns 35a may be formed simultaneously as the mold patterns 30P are formed. In this case, the mold patterns 30P and the reinforcing patterns 35a may be patterned via a photolithography operation for forming a mask layer having a cross-stripes pattern and an etching operation. Since the reinforcing patterns 35a may consume bottom electrode areas of memory cells adjacent thereto, it is preferable to minimize application of the reinforcing patterns 35a.

In another selective embodiment, as shown in FIG. 5B, the supporting structures may be reinforcing patterns 35b that extend across the mold patterns 30P and lifted up from the substrate 10. According to an embodiment, the reinforcing patterns 35b lifted up from the substrate 10 may be formed by forming a sacrificing layer (not shown) supporting the reinforcing patterns 35b on the substrate 10 first, forming the reinforcing patterns 35b, and then removing the sacrificing layer. However, the above-stated reinforcing patterns 35a and 35b are merely examples, and the present invention is not limited thereto. Technical features regarding supporting structures for supporting cylindrical bottom electrodes in the related art may be applied to the reinforcing patterns 35a and 35b.

Figure 6:
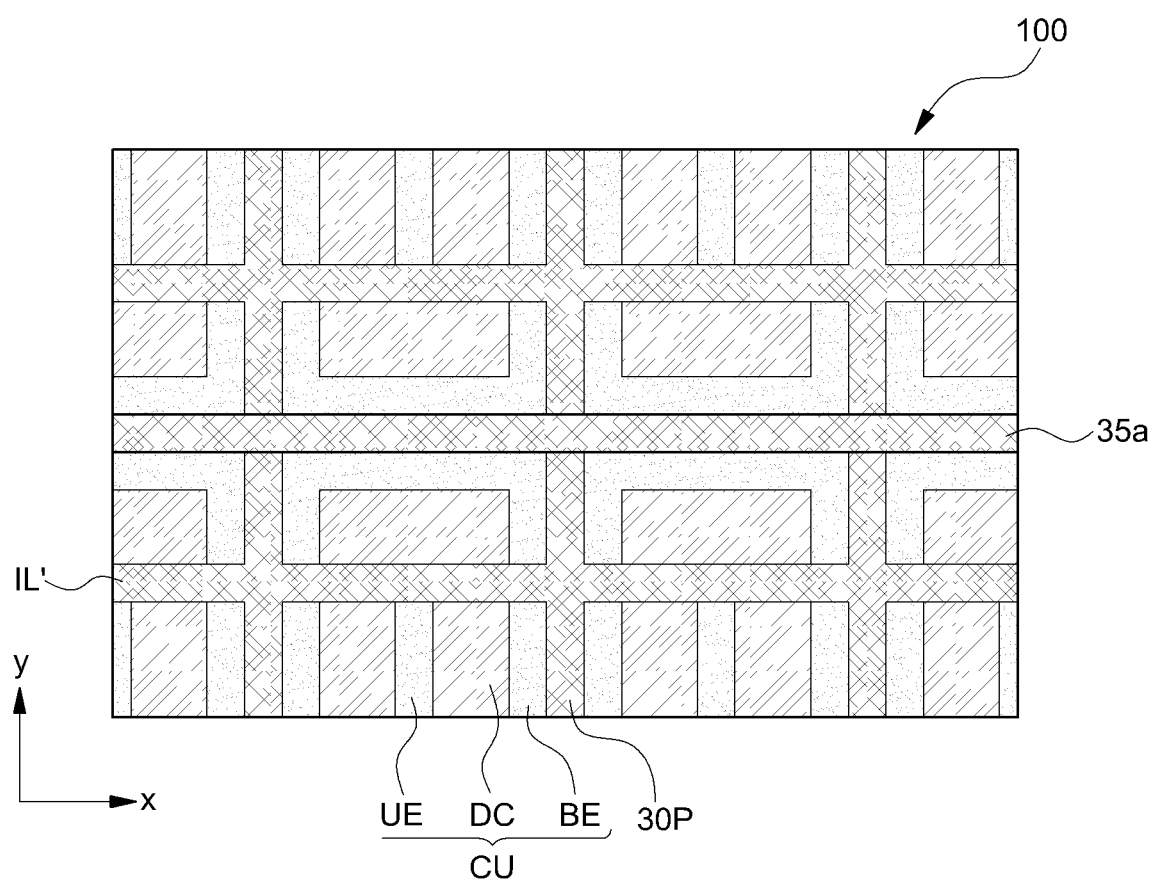
FIG. 6 is a top transparent view of a capacitor of the semiconductor memory device according to another embodiment of the present invention.

FIG. 6 is a top transparent view of a capacitor of the semiconductor memory device according to another embodiment of the present invention In a semiconductor memory device according to an embodiment of the present invention, by using vertical plate-like bottom electrodes that are provided on and supported by sidewalls of mold insulators, a dielectric layer and an upper electrode may be sequentially formed on the bottom electrodes. Therefore, a semiconductor memory device including high density integrated capacitors exhibiting simple bottom electrode structure in order to confront the trend of harsh scaling down, securing sufficient capacitance, and reducing defect causes including leakage current and insulation breakdown may be provided.

Furthermore, according to another embodiment of the present invention, a method of fabricating a semiconductor memory device for easily and reliably fabricating a semiconductor memory device having the above-stated advantages may be provided.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A semiconductor memory device comprising a plurality of memory cells, wherein the plurality of memory cells comprise a plurality of switching devices and a plurality of capacitors that are electrically connected to the plurality of switching devices, respectively and wherein the semiconductor memory device further comprises:

a plurality of contacts that are electrically connected to the switching devices, provided on a substrate, and are arranged in a first direction and a second direction different from the first direction, wherein the first direction and the second direction are parallel to the substrate;

mold insulators, wherein each of the mold insulators is provided on the substrate between the two contacts adjacent to each other in the first direction, has a predetermined thickness and a predetermined width in the second direction, and extends by a predetermined height in a direction vertical to the substrate, and wherein each of the mold insulators has a vertical plate structure and the mold insulators are spaced apart and separated from one another at least in the first direction;

bottom electrodes provided on side surfaces of the mold insulators, wherein each of the bottom electrodes has a vertical plate structure and is electrically connected to each of the plurality of contacts;

a dielectric layer disposed on the mold insulators and the bottom electrodes; and an upper electrode disposed on the dielectric layer, wherein the bottom electrodes, the dielectric layer and the upper electrode constitute the plurality of capacitors, wherein the bottom electrodes comprise a first bottom electrode and a second bottom electrode, the mold insulators comprise a single mold insulator disposed between the first and second bottom electrodes, and the single mold insulator comprises a first side surface contacting the first bottom electrode and a second side surface contacting the second bottom electrode, wherein the single mold insulator, the first bottom electrode and the second bottom electrode constitute a vertical unit structure, a plurality of vertical unit structures corresponding to the vertical unit structure are provided on the substrate, the plurality of vertical unit structures are spaced apart and separated from one another, and no portion of the mold insulators is extended between the vertical unit structures.

2. The semiconductor memory device of claim 1, wherein surfaces of the bottom electrodes have uneven surface morphologies.

3. The semiconductor memory device of claim 1, wherein each of the first and second bottom electrodes has a width corresponding to the width of the single mold insulator in the second direction and a height corresponding to the height of the single mold insulator in the vertical direction of the substrate.

4. The semiconductor memory device of claim 1, wherein the mold insulators have a line pattern.

5. The semiconductor memory device of claim 1, wherein two capacitors adjacent to each other arranged in the first direction have the first bottom electrode and the second bottom electrode, respectively, and the first bottom electrode and the second bottom electrode are supported by both sidewalls of the single mold insulator and are electrically separated from each other by the single mold insulator.

6. The semiconductor memory device of claim 1, wherein the number of the mold insulators in the first direction is ½ of the number of memory cells in the first direction.

7. The semiconductor memory device of claim 1, wherein each of the bottom electrodes contacts a surface of each of the plurality of contacts.

8. The semiconductor memory device of claim 1, wherein a repeating unit of a memory cell structure has an area of 2 F×4 F, and the semiconductor memory device has a design rule of 4F2, in which two memory cells are disposed per repeating unit.

9. The semiconductor memory device of claim 1, further comprising a supporting structure that is disposed between the mold insulators to support the mold insulators.

10. The semiconductor memory device of claim 9, wherein the supporting structure comprises reinforcing patterns provided on the substrate or provided at an interval on the substrate.

11. The semiconductor memory device of claim 1, wherein a thickness of the dielectric layer is larger than a thickness of the single mold insulator or one of the bottom electrodes.

12. The semiconductor memory device of claim 1, wherein the dielectric layer is provided as a separate layer from the mold insulators so as to cover the mold insulators and the bottom electrodes.

13. The semiconductor memory device of claim 1, wherein no portion of the upper electrode is inserted between the first bottom electrode and the second bottom electrode.

* * * * *